US005892833A

United States Patent [19]

Maag et al.

[11] Patent Number: 5,892,833

[45] Date of Patent: Apr. 6, 1999

[54] GAIN AND EQUALIZATION SYSTEM AND METHOD

[75] Inventors: Clifford Maag, Provo; Lance Parker; Quinn Jensen, both of Orem, all of Utah

[73] Assignee: Night Technologies International, Provo, Utah

[21] Appl. No.: 18,687

[22] Filed: Feb. 5, 1998

Related U.S. Application Data

[63] Continuation of Ser. No. 485,082, Jun. 7, 1995, which is a continuation-in-part of Ser. No. 413,398, Mar. 30, 1995, Pat. No. 5,717,773, which is a continuation-in-part of Ser. No. 54,036, Apr. 28, 1993.

[51] Int. Cl.[6] ................................ H03G 5/00; H04R 1/02

[52] U.S. Cl. .......................... 381/98; 381/94.3; 381/94.1; 381/103

[58] Field of Search ................................ 381/71.1, 94.1, 381/94.3, 98, 94.7, 93, 120, 121, 108, 103, 124; 333/28 T, 28 R, 78

[56] References Cited

U.S. PATENT DOCUMENTS

| | | |
|---|---|---|
| 3,846,719 | 11/1974 | Dolby . |
| 4,359,601 | 11/1982 | England . |
| 4,661,982 | 4/1987 | Kitazato . |
| 4,773,094 | 9/1988 | Dolby . |
| 4,837,832 | 6/1989 | Fanshel . |
| 4,845,758 | 7/1989 | Op de Beek et al. . |
| 4,922,535 | 5/1990 | Dolby . |
| 5,515,446 | 5/1996 | Velmer . |

FOREIGN PATENT DOCUMENTS

| | | |
|---|---|---|
| 55-105414 A | 8/1980 | Japan . |
| 61-167212 | 7/1986 | Japan . |
| 62-95008 A | 5/1987 | Japan . |
| 5-7120 A | 1/1993 | Japan . |
| WO 93/02503 | 2/1993 | WIPO . |

OTHER PUBLICATIONS

Valkenburg, “Analog Filter Design,” 1982.

Scidmore, “Lecture Notes ECE 341 –Linear Active Circuits,” 1982, 1987, 1991.

Greiner, Schoessow, “Design Aspects of Graphic Equalizers,” J. Audio Eng. Soc., vol. 31, No.6, Jun. 1983, pp. 394–407.

*Primary Examiner*—Curtis A. Kuntz
*Assistant Examiner*—Rexford N. Barnie
*Attorney, Agent, or Firm*—Thorpe, North & Western, LLP

[57] ABSTRACT

A multi-band digital gain and equalizer system for receiving and processing an audio signal includes an analog-to-digital converter for converting the audio signal to a digital signal X, a plurality of digital filters, each for processing and selectively amplifying/attenuating a different frequency band of the signal X, to produce an output signal $Y_n$, in which the waveform of the frequency response is concave downward for the central frequencies of the band and concave upward for the frequencies above and below the central frequencies, a summing circuit for summing the output signals $Y_n$ to produce a resultant digital signal, and a digital-to-analog converter for converting the resultant digital signal to a resultant analog audio signal. The center frequencies of each band processed by a digital filter is separated from adjacent center frequencies of bands processed by other digital filters, by about two octaves. An additional digital filter is provided for processing a frequency band of the signal X which is higher than the frequency bands processed by the plurality of digital filters, to produce an output signal $Y_{n1}$ whose waveform of the frequency response is concave upward for the lower frequencies of the band, concave downward for the low to central frequencies of the band, and generally flat for the higher frequencies of the band. The summing circuit sums the output signals $Y_n$ and $Y_{n1}$ to produce an output signal whose frequency response is substantially flat, with a “floor” at the low end of the frequencies and a “shelf” at the high end of the frequencies, and with little phase shift.

6 Claims, 5 Drawing Sheets

GAIN AND EQUALIZATION SYSTEM AND METHOD

This application is a continuation of application Ser. No. 08/485,082 filed Jun. 7, 1995, entitled "Gain and Equalization System and Method", which is a continuation-in-part of application Ser. No. 08/413,398, filed Mar. 30, 1995, now U.S. Pat. No. 5,717,773 which is a continuation-in-part of application Ser. No. 08/054,036, filed Apr. 28, 1993.

BACKGROUND OF THE INVENTION

This invention relates to a gain and equalization system and more particularly to a digital gain and equalization system for reducing distortion, phase shift and other anomalies, and improving "clarity" in a variety of currently available sound systems.

Sound generation, recording and reproduction systems may take a variety of forms and perform a variety of functions, all relating, of course, to processing sound signals, with the common objective being to ultimately reproduce as accurately as possible the sound originally created or recorded or even "enhance" it. Such systems include, among others, public address systems and similar systems which utilize microphones and speakers, radio and television broadcast systems, radio and television receivers, tape recorders and disk recorders and players, home, auto and portable stereo systems, and recording studio systems. In all such systems, the sound is converted to electrical audio signals representing the sound, processed in some way, and then either reproduced, transmitted to other locations or recorded. At the various stages of generating the sound and processing the audio signals, there is a chance that either noise will be introduced to mask the true signals or the signals will be distorted (undesired change in signal waveform) in such a way that it is difficult to accurately reproduce the sound. Such noise and/or distortion may arise in the sound source itself, for example, instruments, voices, etc., in the room or studio acoustic configuration, in microphones which pick up the sound and convert it to electrical audio signals, in audio amplifiers and other audio signal processing components, in recording equipment and recording media, in speaker systems, and in audio signal transmitting equipment.

Ideally, all noise would be removed from (or not allowed to initially influence) the audio signal, and all processing of the audio signal would take place free from distortion, e.g., amplification would occur equally and uniformly over the entire audio signal frequency band (audio spectrum). However, achieving an essentially undistorted resultant audio signal has not been possible; rather in the course of reproducing an audio signal and otherwise processing such a signal, distortion of some form (phase distortion, frequency distortion, harmonic distortion, intermodulation distortion and the addition of noise) is inevitably introduced.

Distortion, which is frequency dependent, means that the signal being processed is treated differently, e.g. amplified or phase shifted by different amounts, at the different frequencies contained in the signal. Such distortion prevents the accurate reproduction of the original sound transmitted, recorded, or produced.

In an attempt to reduce, to the extent possible, distortion and other undesirable deficiencies produced by room acoustics, microphones, loudspeakers, recorders, and other audio signal producing and processing components, what are called "equalizers" are provided. Equalizers effect or introduce a kind of controlled distortion of the frequency response which is ideally flat, for the purpose of offsetting or cancelling the distortion introduced during signal origination production and processing. Equalizers, in effect, alter the frequency response of an audio system in some desired manner. Initially equalizers were constructed of passive components, to provide attenuation or cuts at certain frequencies. Later designs were usually constructed with active components, typically vacuum tube circuits and operational amplifiers.

Among the more well known equalizers in use today is the so-called graphic equalizer which is incorporated into many professional, home and automobile sound systems. The graphic equalizer is generally constructed so that the console and controls present the appearance of a graphic display of the frequency response being developed by the equalizer, e.g., which bands of the audio signal are boosted and which are cut.

In another type of equalizer, known as the parametric equalizer, three parameters of equalization, including frequency selection, boost or cut, and bandwidth control, are all independently variable.

More elaborate studio equalizers are utilized in recording, broadcast and television studios and these consist basically of a parallel bank of band-pass filters in which the center frequencies of the filters are separated by some finite amount such as an octave or fraction thereof, typically one-third. The gain or attenuation of each filter is separately adjustable, the result of which is an overall frequency response which can be continuously set across the entire audio frequency range.

In spite of the various approaches to performing "equalization", performing it in a high quality fashion, with little phase shift, and in a simple and inexpensive manner has been difficult to achieve.

SUMMARY OF THE INVENTION

It is an object of the invention to provide a new and improved digital equalizer system and method for processing and performing equalization on audio signals.

It is a further object of the invention to provide such a system and method which is capable of selectively providing gain as well as equalization to an audio input signal.

It is another object of the invention to provide such a system and method for effectively reducing distortion, thereby improving clarity in currently available sound systems.

It is still another object of the invention to provide a simple to implement digital equalizer which is relatively inexpensive and yet effective in performing equalization without significant phase shift.

It is also an object of the invention to provide such a system and method which may be implemented as part of an audio preamplifier and in other environments requiring equalization.

It is a further object of the invention to provide a digital gain and equalization system and method having a substantially undistorted (flat) frequency response.

It is still a further object of the invention to provide such a system and method which reduces phase shift especially at higher frequencies of an audio signal.

The above and other objects of the invention are realized in a specific illustrative embodiment of a digital gain and equalization system for processing a received audio signal to produce an amplified and "equalized" resultant audio signal having very little phase shift. The digital gain and equalization system includes an analog to digital converter for digitizing the received audio signal, a plurality of digital filters coupled to the analog to digital converter for receiving and processing a selected frequency band of the audio signal and for producing a respective output signal, a digital summing circuit for summing the outputs from the digital filters, and a digital to analog converter for converting the summed outputs to an analog audio signal.

Each digital filter simulates the function of an operational amplifier in which the operational amplifier includes an inverting input, a non-inverting input for receiving the audio signal, an output, a high pass filter network coupled between the inverting input and ground potential for determining the lower end of the frequency band processed by the operational amplifier, and a low pass filter network coupled between the output and the inverting input for determining the upper end of the frequency band processed by the operational amplifier. Each digital filter is programmed to develop a respective output signal whose frequency response waveform is concave downward over the central frequencies of the band processed, and is concave upward over the frequencies above and below the central frequencies. With this waveform characteristic, when the individual filter outputs are summed, the frequency response of the resulting output is substantially flat and with little phase shift.

In accordance with one aspect of the invention, one or more of the digital filters which process the higher frequency bands are programmed to extend the high frequency response, i.e., add higher frequencies to the audio signal, with very little phase shift. This produces an output frequency response with one or more "shelves" at the higher frequencies.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
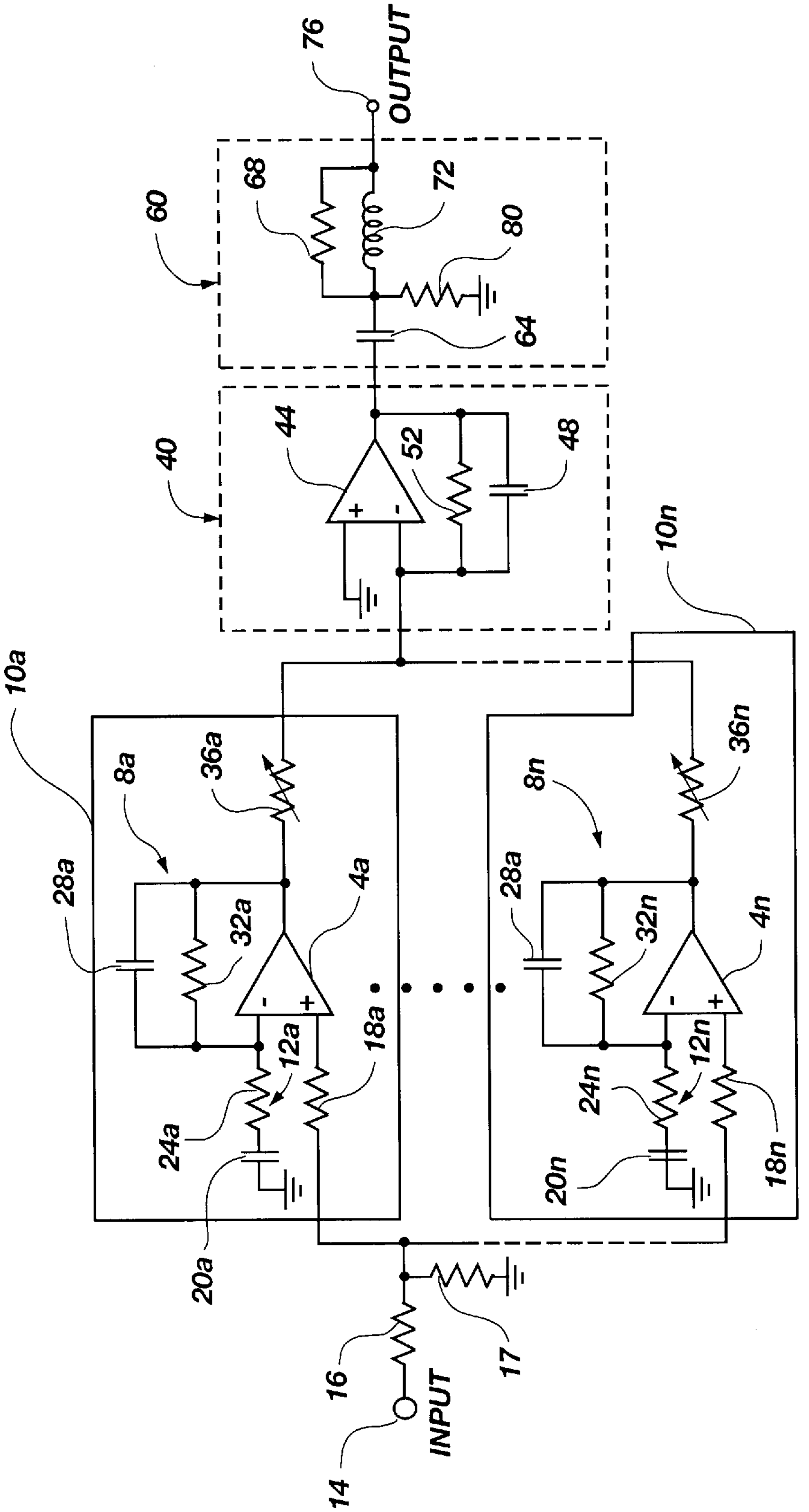
FIG. 1 shows a schematic of a gain and equalization circuit made in accordance with the principles of the present invention.

Referring to FIG. 1, there is shown an illustrative embodiment of an equalizer circuit made in accordance with the present invention to include a plurality of operational amplifiers 4, with associated feedback circuitry 8 and input circuitry 12, connected in parallel with one another (each individual combination of operational amplifiers and associated circuitry shown as 10). An audio signal input terminal 14 is coupled by way of a resistor divider 16 and 17, and resistors 18 to respective non-inverting inputs of the operational amplifiers 4. A plurality of input circuits 12 composed of series connections, of a capacitor 20 and a resistor 24, are coupled between ground potential and the inverting input of a respective operational amplifier 4. A plurality of feedback circuits each composed of a parallel connection of a capacitor 28 and resistor 32, couples the output of a respective operational amplifier 4 to the inverting input thereof, as shown.

The output of each operational amplifier 4 is coupled to a summing circuit 40 which includes a plurality of variable resistors 36, each coupled to the output of a different operational amplifier 4. The summing circuit 40 also includes an operational amplifier 44 whose non-inverting input is coupled to ground and whose output is coupled by way of a parallel connection of a capacitor 48 and a resistor 52 to the inverting input of the amplifier. Each of the variable resistors 36 is likewise coupled to the inverting input of the operational amplifier 44.

The output of the summing circuit 40 is coupled to an output load isolation circuit 60 which is composed of a capacitor 64, a resistor 68 and inductor 72 coupled in parallel between the capacitor 64 and an output terminal 76, and a resistor 80 coupled from ground potential to the node between capacitor 64, resistor 68 and inductor 72.

Each of the operational amplifiers 4, with the associated input and feedback circuitry, acts as a filter to pass a different frequency band of the input audio signal. For example, if a six band equalizer were desired, and therefore six operational amplifiers were provided, the frequency centers for the six bands could illustratively be, but not limited to, about 10 Hz, 40 Hz, 160 Hz, 640 Hz, 2560 Hz and 10240 Hz with the skirts varying ≈1½ dB at one octave from the respective center frequency, ≈6 dB at two octaves, ≈10 dB at three octaves, and ≈13½ dB at four octaves. The values of the feedback R/C network of capacitors 28 and resistors 32, and the input R/C network of capacitors 20 and resistors 24 are selected to provide the respective center frequencies of the bands in question. The feedback R/C network 8 of each operational amplifier forms a low pass filter to determine the high end roll-off or cut-off of the bands in question, while the input R/C network 12 of each operational amplifier forms a high pass filter to determine the low end roll-off of the band. With the configuration of FIG. 1, the same value capacitors can be used for capacitors 20, and same value capacitors can be used for capacitors 28, with different value resistors being required to provide the desired operating characteristics. For example, to obtain, the center frequencies identified above for a six band equalizer, suitable values for the capacitors and resistors could be:

capacitors 20*a*–20*f*=2 μf
capacitors 28*a*–28*f*=0.2 μf
resistor 20*a*=8 ohms
resistor 20*b*=32 ohms
resistor 20*c*=128 ohms
resistor 20*d*=512 ohms
resistor 20*e*=2048 ohms
resistor 20*f*=8192 ohms
resistor 32*a*=80 ohms resistor 32*b*=320 ohms
resistor 32*c*=1280 ohms
resistor 32*d*=5120 ohms
resistor 32*e*=20,480 ohms
resistor 32*f*=81,920 ohms Exemplary values for the other circuit components are:
resistors 18=1.0 k ohms
variable resistors 36=from 1.1 k ohms to 101.1 k ohms
resistor 52=11.1 k ohms
capacitor 48=22 pf
capacitor 64=470 $\mu$f
resistor 80=10 k ohms
resistor 68=47 ohms
inductor 72=100 $\mu$Henrys The operational amplifiers 4 of FIG. 1 might illustratively be, but is not limited to, model NE5532 AN amplifiers, made by Signetics.

With the circuit configuration described, phase distortion (phase shift) is reduced, with the center frequencies having substantially no phase shift when measured at the output of each band, and with only marginal phase shift occurring toward the high and low ends of the band. The resultant signal (from summing all band contributions) is a high clarity, substantially distortion free audio signal.

Figure 2:
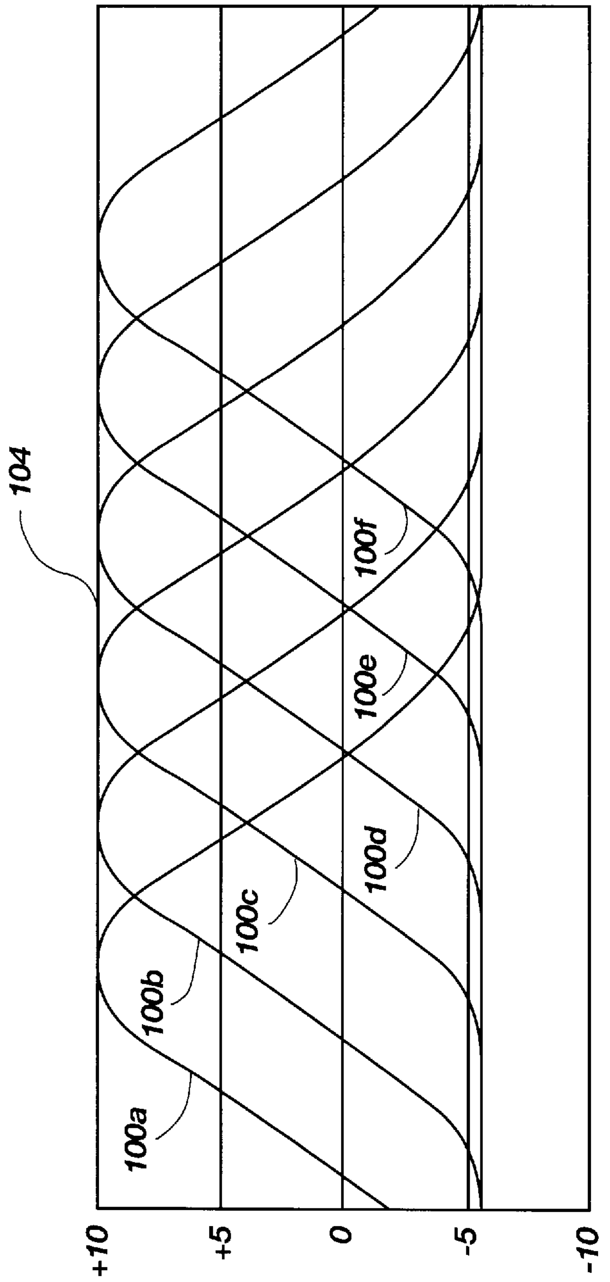
FIG. 2 shows individual frequency response waveforms produced by the operational amplifier circuits of FIG. 1, and a resultant frequency response waveform produced by combining the individual waveforms.

FIG. 2 shows frequency response waveforms of the outputs of several of the adjacent operational amplifiers of FIG. 1, together with the resulting waveform obtained from combining or summing the several waveforms, to indicate the flat frequency response achievable.

Note that each of the several waveforms is concave downward for the central frequencies of the waveform and concave upward for the frequencies above and below the central frequencies.

The resistor divider 16 is provided to attenuate or reduce the input level of the audio signal supplied to the input terminal 14 if the magnitude of such a signal is too great, such as when the audio signal being received is from an audio line amplifier. In the course of performing equalization by the operational amplifiers 4 and associated circuitry, the audio signal is again boosted to the desired level, but with the ability to tailor the frequency response.

If no attenuation of the audio input signal is necessary, then resistor divider 16 would be eliminated from the FIG. 1 circuit. This would be the case if, for example, the equalizer circuit of FIG. 1 were utilized as a combination equalizer/preamplifier in a microphone/speaker system. In such case, the circuitry of FIG. 1 would simply be substituted for the conventional pre-amplifier in the microphone/speaker system and the operational amplifiers 4 with associated circuitry, would provide both the desired amplification or "pre-amplification" and equalization of the signals received from the microphone.

Resistors 18 are provided to stabilize the operation and processing of the input signal by the operational amplifiers 4.

Variable resistors 36 are provided to either selectively allow gain in or to attenuate the respective band being supplied thereto. Advantageously, eleven position variable resistor switches are provided, each to provide five levels of gain and five levels of attenuation, with a central position being one in which no change in signal level occurs. In this manner, the contribution of each operational amplifier to the resulting "equalized" signal can be determined by manual adjustment of the variable resistors 36. The contributions from each operational amplifier are combined by the summing circuit 40 and then passed via the isolator circuit 60 to the output terminal 76.

Figure 3:
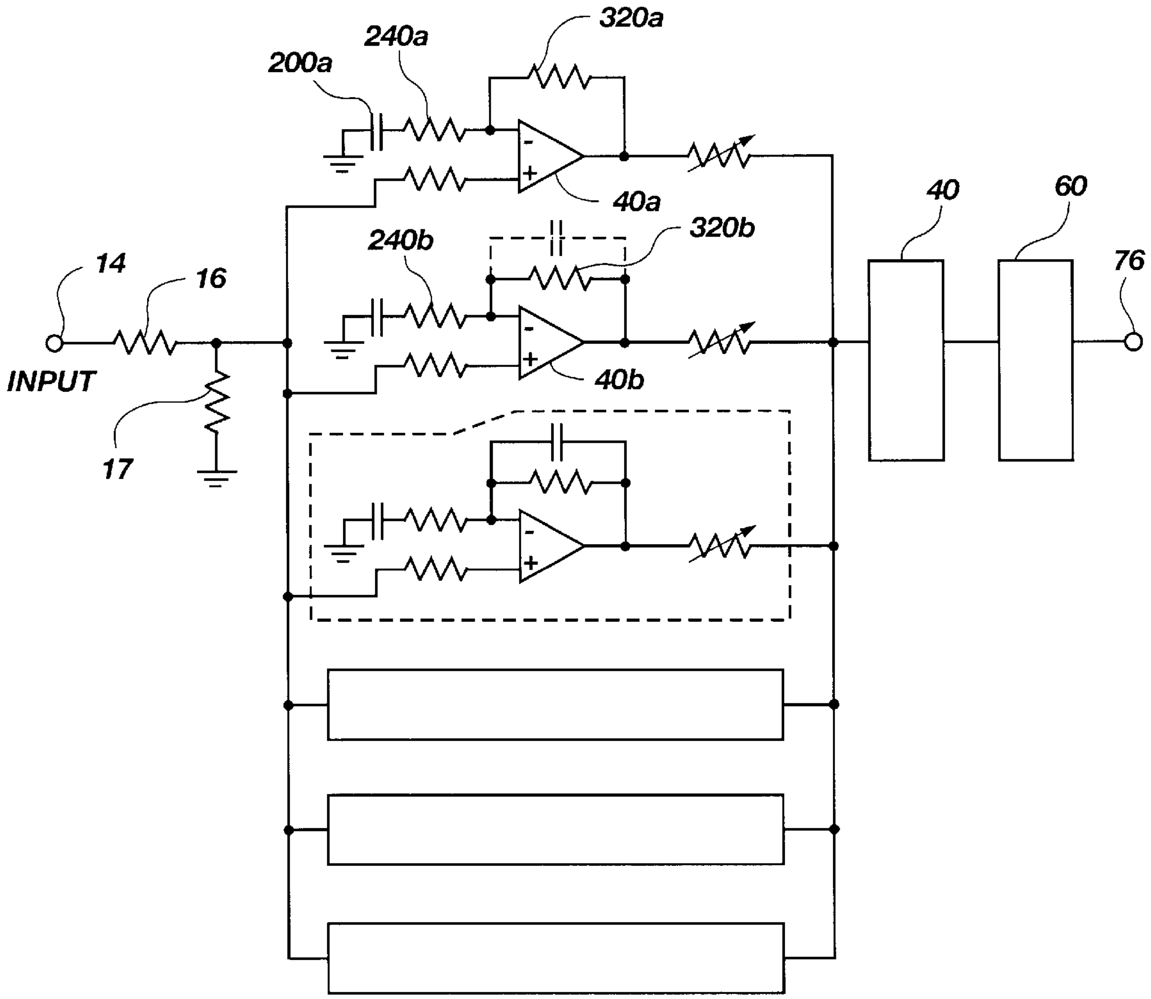
FIG. 3 shows a schematic of another embodiment of the invention, in which higher frequencies of an audio signal are processed with very little phase shift.

FIG. 3 shows a schematic of another embodiment of the invention in which the only difference between the FIG. 3 circuitry and the FIG. 1 circuitry is that at least the operational amplifier 40*a* and associated circuitry which processes the highest frequency band (and in another embodiment also the operational amplifier 40*b* and associated circuitry which processes the next highest frequency band) omits the capacitor in the feedback circuit, leaving only resistor 320*a* (and resistor 320*b* in the second alternative embodiment), as illustrated. The effect of omitting this capacitor in the feedback circuit is that the higher frequencies in the band being processed are not rolled off or filtered but rather are passed. This is illustrated in the FIG. 4 diagram showing the output waveforms of the operational amplifier circuits of FIG. 3, with waveform 130 representing the frequency response of the operational amplifier 40*a* of FIG. 3. Note that the upper frequencies of the band being processed by operational amplifier 40*a* are not filtered and so the waveform, after it reaches its peak, continues at that level to form a "shelf" 130*a*.

Exemplary values for resistor 320*a* is 200 ohms, for resistor 320*b* (in the second alternative embodiment) is 511 ohms, for resistor 240*a* is 20 ohms, for resistor 240*b* is 64.9 ohms, for capacitor 200*a* is 1 microfarad, and for capacitor 200*b* is 2 microfarads. Exemplary values for the other components of FIG. 3 are the same as outlined for the corresponding components of FIG. 1.

Figure 5:
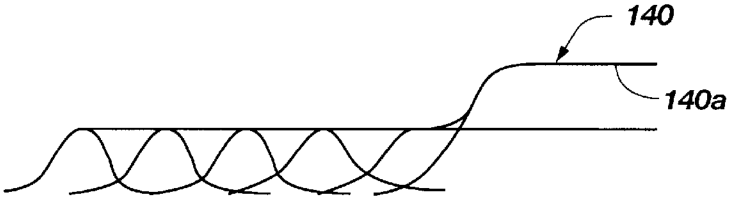

FIG. 5 shows the frequency response waveforms of the operational amplifiers circuits of FIG. 3 when the capacitor in the feedback circuit of operational amplifier 40*b* is also removed. In this case, the frequency response waveforms of operational amplifier 40*a* and operational amplifier 40*b* combined to produce a resultant frequency response waveform 140 for the higher frequencies of the respective bands, having a higher level "shelf" 140*a*.

The effect of removal of the capacitor from the feedback circuit of the operational amplifiers processing the higher end frequency bands is to extend the high frequency response while providing better definition and clarity since less phase shift has occurred at these higher frequencies. Note that the frequency response waveform of operational amplifier 40*a* and 40*b* is concave upward for the lower frequencies being processed, concave downward for the low to central frequencies, and generally flat for the higher frequencies.

FIG. 6 shows a digital implementation of the previously described analog voltage gain and equalization circuits, for processing an audio signal received via lead 204. The signal is supplied to an analog-to-digital converter 208 which produces a digitized signal X which is then supplied to a plurality of digital filters 212. The digital filters 212 perform digital processing of the signal X for a corresponding bandwidth of frequencies, to simulate the processing carried out by the analog gain and equalization circuits previously described. The digital filters illustratively could be Motorola's DSP 56001 signal processors.

Figure 4:
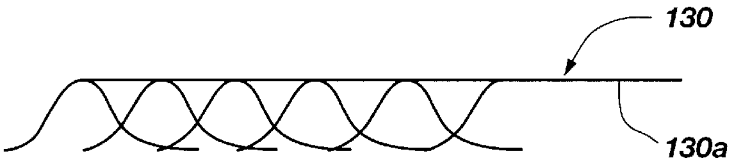
FIGS. 4 and 5 show frequency response waveforms produced by two different implementations of the FIG. 3 circuit.
Figure 6A:
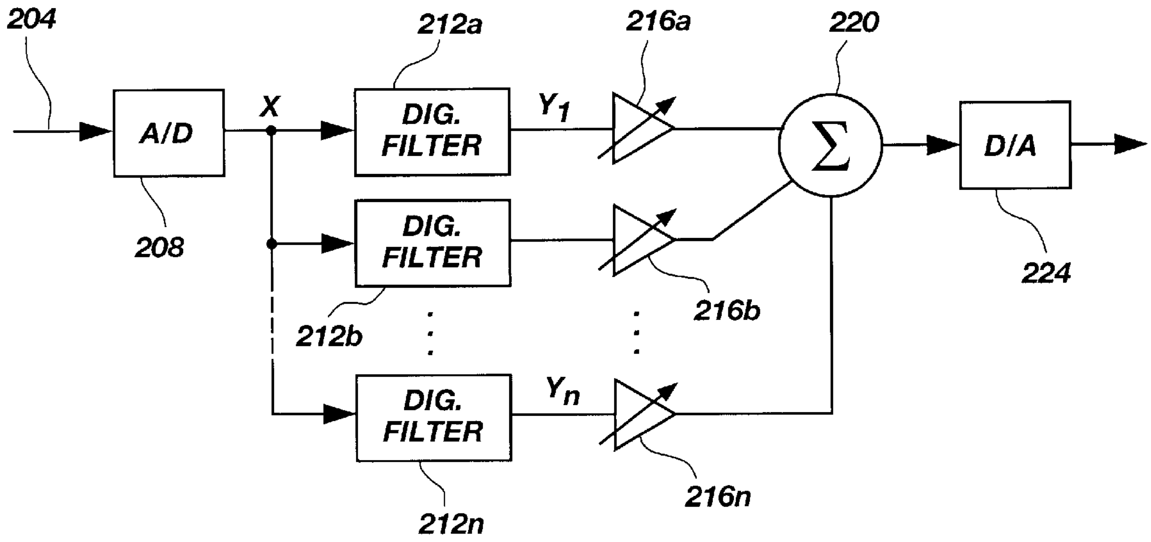
FIG. 6A shows a schematic of the digital implementation of a gain and equalization system made in accordance with the principles of the present invention.
Figure 6B:
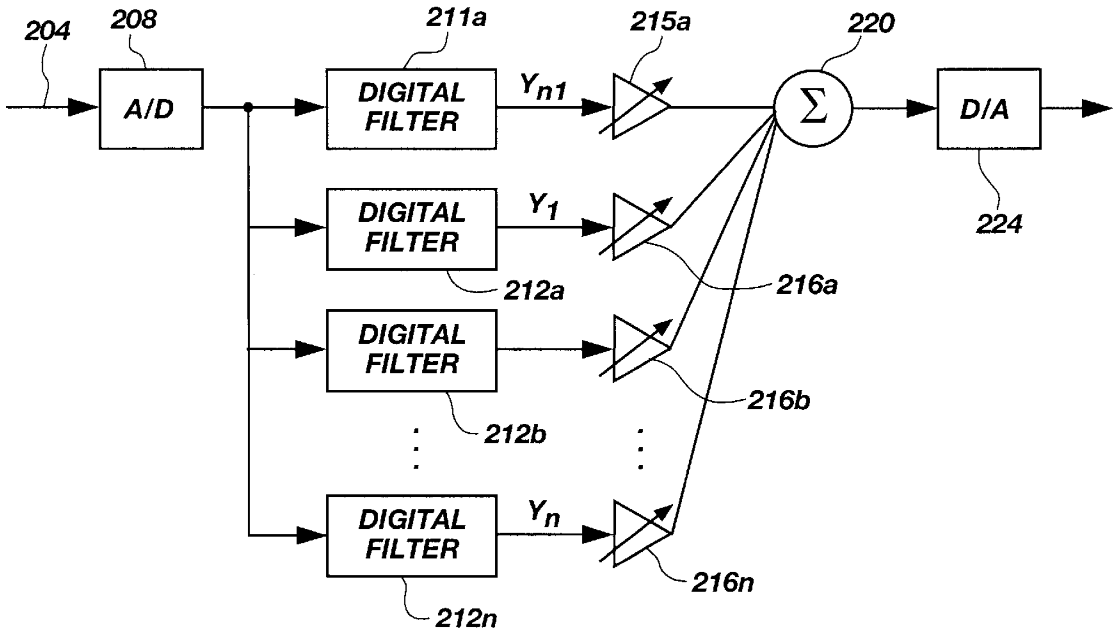
FIG. 6B shows an alternative embodiment of a schematic of the digital implementation of a gain and equalization system which generates an output waveform having a shelf at the upper frequencies.

In FIG. 6B, the digital filter 211*a* advantageously the processing of the operational amplifier 40*a* of FIG. 3 to thereby generate output $Y_{n1}$, whereas the remaining digital filters simulate the processing of operational amplifiers 4*a* through 4*n* of FIG. 1, so that when the digital filter outputs ($Y_{n1}$ and $Y_n$) are combined or summed in the summer 220 (to be discussed momentarily), the frequency response waveform would be similar to that shown in FIG. 4 which includes a "shelf" 130*a*, as shown.

Figure 6C:
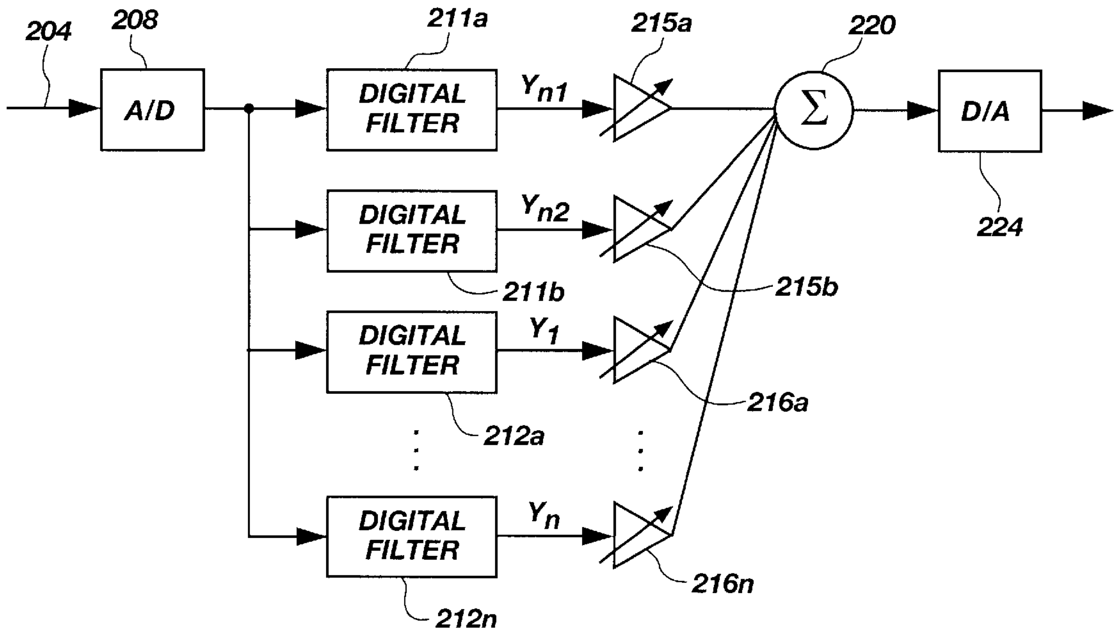
FIG. 6C shows another alternative embodiment of a schematic of the digital implementation of a gain and equalization system which generates an output waveform having two shelves at the upper frequencies.

Furthermore, FIG. 6C shows that if digital filter 211*b* as well as digital filter 211*a* is programmed to process audio signals to simulate operational amplifier 40*a* (FIG. 3) to thereby generate the output $Y_{n2}$, then the frequency response of the summed outputs of the digital filters $Y_n$, $Yn_1$, and $Yn_2$ would be similar to the waveform shown in FIG. 5 and would include a second level "shelf" 140*a* at the higher frequencies, as shown.

A FIG. 6A, the outputs $Y_1$, . . . $Y_n$ are supplied to respective attenuators 216*a*, . . . 216*n*, and then the attenuated signals are supplied to a digital summing circuit 220. In FIGS. 6B and 6C, the outputs $Yn_1$ and $Yn_2$ are supplied to respective attenuators 215*a* and 215*b* before being summed in summing circuit 220 combines or adds the inputs to develop a resultant output audio signal which is supplied to a digital-to-analog converter 224 which convents the digital resultant output signal to an analog resultant output signal.

Figure 7:
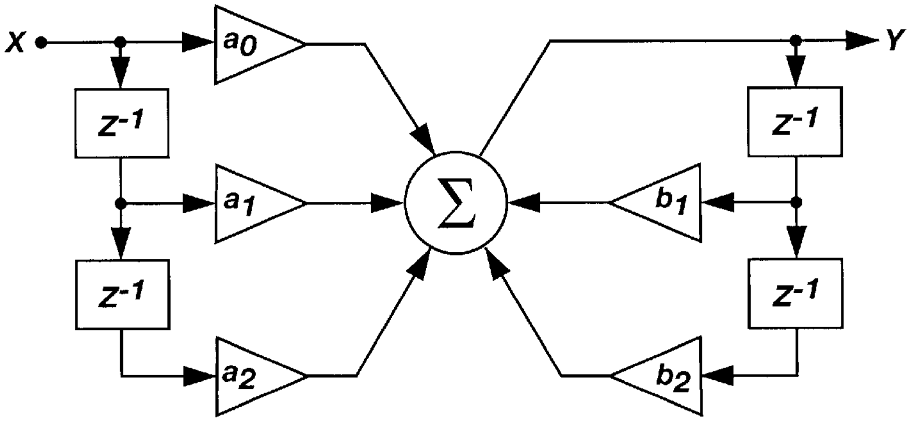
FIG. 7 shows a flow diagram of the processes being carried out by the digital filters of FIG. 6.

FIG. 7 is a flow diagram of the processing performed by each of the digital filters 212 of FIG. 6. This flow diagram is explained in Motorola's publication "Implementing IIR/FIR Filters with Motorola's DSP 56000/DSP 56001," by John Lane and Garth Hillman, APR 7/D, Rev. 2, Motorola Copyright, 1993. Generally, the output Y is computed according to the following formula:

$$Y(n)=a_0X[n]+a_1X[n-1]+a_2X[n-2]+b_1Y[n-1]+b_2Y[n-2],$$

where n is the sample identification of the analog signal, X is the value of the sample supplied to the digital filters, and $a_0$, $a_1$, $a_2$, $b_1$ and $b_2$ are the filter co-efficients shown as gain elements in the FIG. 7 flow diagram and derived from and representing the impedances connected to the operational amplifiers (of FIG. 3) being simulated. Exemplary coefficient values for the flow diagram of FIG. 7, for various sampling rates and for each of six frequency bands processed, having the center frequencies indicated, are given below:

SAMPLING RATE = 48.0 kHz

| | | BANDS | | | | | |
|---|---|---|---|---|---|---|---|
| | | 10Hz/ SUB | 40 Hz | 160 Hz | 650 Hz | 2.5 kHz | 10 kHz/ AIR |
| COEFFICIENT VALUES | a0 | 0.07850608 | 0.07998622 | 0.08580608 | 0.10753704 | 0.64663772 | 0.59098416 |
| | a1 | −0.15583149 | −0.15523755 | −0.15287984 | −0.14373493 | −0.63504640 | −0.53754979 |
| | a2 | 0.07732553 | 0.07525334 | 0.06710553 | 0.03668218 | 0.00000000 | 0.00000000 |
| | b1 | 1.99747634 | 1.98986315 | 1.95964162 | 1.84242042 | 0.85142042 | 0.31506849 |
| | b2 | −0.99747793 | −0.98988884 | −0.96004882 | −0.84862825 | 0.00000000 | 0.00000000 |

SAMPLING RATE = 44.10 kHz

| | | BANDS | | | | | |
|---|---|---|---|---|---|---|---|
| | | 10Hz/ SUB | 40 Hz | 160 Hz | 650 Hz | 2.5 kHz | 10 kHz/ AIR |
| COEFFICIENT VALUES | a0 | 0.07854952 | 0.08015965 | 0.08648005 | 0.10992517 | 0.64292633 | 0.57590500 |
| | a1 | −0.15581409 | −0.15516781 | −0.15260446 | −0.14269421 | −0.63039228 | −0.51945479 |
| | a2 | 0.07726472 | 0.07501053 | 0.06616198 | 0.03333880 | 0.00000000 | 0.00000000 |
| | b1 | 1.99725331 | 1.98896917 | 1.95611167 | 1.82908028 | 0.83933627 | 0.27641100 |
| | b2 | −0.99725520 | −0.98899959 | −0.95659322 | −0.83638367 | 0.00000000 | 0.00000000 |

SAMPLING RATE = 32.0 kHz

| | | BANDS | | | | | |
|---|---|---|---|---|---|---|---|
| | | 10Hz/ SUB | 40 Hz | 160 Hz | 650 Hz | 2.5 kHz | 10 kHz/ AIR |
| COEFFICIENT VALUES | a0 | 0.07875156 | 0.08096475 | 0.08958499 | 0.12060412 | 0.62627271 | 0.51598855 |
| | a1 | −0.15573314 | −0.15484364 | −0.15132929 | −0.13794441 | −0.60950845 | −0.44755506 |
| | a2 | 0.07698186 | 0.07388339 | 0.06181505 | 0.01838827 | 0.00000000 | 0.00000000 |
| | b1 | 1.99621570 | 1.98481397 | 1.93976629 | 1.76819657 | 0.78511260 | 0.12280702 |
| | b2 | −0.99621929 | −0.98487163 | −0.94067332 | −0.78162978 | 0.00000000 | 0.00000000 |

For different sampling rates, different coefficients would be required and would again be based upon the impedances of the operational amplifiers being simulated. The coefficients shown above are for six band widths whose center frequencies are about 10 Hz, 40 Hz, 160 Hz, 640 Hz, 2,560 Hz and 10,240 Hz which, as is evident, represents a two octave doubling of center frequencies. The blocks labeled $Z^{-1}$ of FIG. 7 represents a time delay of one sample each. The circle labeled Σ, of course, represents a summing node.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A gain and equalization system for processing a received digital audio signal X, comprising a plurality of digital filter means each for processing and selectively amplifying/attenuating a different frequency band of the signal X, to produce an output signal $Y_n$ in which the waveform of the frequency response is concave downward for the central frequencies of the band and concave upward for the frequencies above and below the central frequencies, an additional digital filter means for processing and selectively amplifying/attenuating a frequency band of the signal X, the additional digital filter means having a digital feedback circuit with only a resistor to thereby pass a frequency which is higher than the frequency bands processed by the plurality of digital filter means, to produce an output signal $Y_{n1}$ whose waveform of the frequency response is concave upward for the lower frequencies of the band, concave downward for the low to central frequencies of the band, and generally flat for the central to high frequencies of the band, and means for summing the output signals $Y_n$ and $Y_{ni}$ to produce a resultant digital signal whose waveform of the frequency response is concave upward for the lower frequencies, and generally flat for the remaining frequencies.

2. A system as in claim 1 further including analog-to-digital converter means for converting an analog audio signal to the digital audio signal X, for supplying to the digital filter means.

3. A system as in claim 2 further including.

4. A system as in claim 1 wherein the digital filter means each includes means for processing a respective frequency band of the signal X, where the center frequency of each band processed by a digital filter means is separated from adjacent center frequencies of bands processed by other digital filter means, by about two octaves.

5. A system as in claim 1 further including another digital filter means for processing and selectively amplifying/attenuating a frequency band of the signal X which is still higher than the frequency bands processed by the plurality of digital filter means and the additional filter means, to produce an output signal $Y_{n2}$ whose waveform of the frequency response is concave upward for the lower frequencies of the band, concave downward for the low to central frequencies of the band, and generally flat for the central to high frequencies of the band, and wherein said summing means includes means for summing the output signals $Y_n$, $Y_{n1}$, and $Y_{n2}$ to produce a resultant digital signal whose waveform of the frequency response is concave upward for the lower frequencies, generally flat at a first level for the central frequencies, and generally flat at a higher second "shelf" level for the higher frequencies.

6. A method of equalizing a received analog audio signal comprising the steps of:

(a) sampling the received analog audio signal to develop a corresponding digital audio signal X;

(b) providing a plurality of digital filters, each for processing and selectively amplifying/attenuating a different frequency band of the signal X, to produce an output signal $Y(n)=a_0X[n]+a_1X[n-1]+a_2X[n-2]+b_1Y[n-1]+b_2Y[n-2]$, where n is the sample identification of the analog signal, X is the value of the sample supplied to the digital filters, and $a_0$, $a_1$, $a_2$, $b_1$, and $b_2$ are filter co-efficients representing impedances of an equivalent analog operational amplifier circuit suitable for producing the output signal Y(n) in which the waveform of the frequency response is concave downward for the central the central frequencies of the band and concave upward for the frequencies above and below the central frequencies;

(c) summing the plurality of output signals Y(n) to produce a resultant digital signal; and (d) converting the resultant digital signal to a resultant analog audio signal.

* * * * *